United States Patent
Hashimoto et al.

(10) Patent No.: US 10,354,863 B2
(45) Date of Patent: *Jul. 16, 2019

(54) SEED CRYSTAL FOR GROWTH OF GALLIUM NITRIDE BULK CRYSTAL IN SUPERCRITICAL AMMONIA AND FABRICATION METHOD

(71) Applicant: SixPoint Materials, Inc., Buellton, CA (US)

(72) Inventors: Tadao Hashimoto, Santa Barbara, CA (US); Edward Letts, Buellton, CA (US); Daryl Key, La Canada, CA (US)

(73) Assignee: SixPoint Materials, Inc., Buellton, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/716,499

(22) Filed: Sep. 26, 2017

(65) Prior Publication Data

US 2019/0096667 A1    Mar. 28, 2019

(51) Int. Cl.
| | | |
|---|---|---|
| *H01L 21/02* | (2006.01) | |
| *H01L 21/20* | (2006.01) | |
| *H01L 21/203* | (2006.01) | |
| *C01G 15/00* | (2006.01) | |
| *C01C 1/00* | (2006.01) | |
| *H01L 21/28* | (2006.01) | |

(52) U.S. Cl.
CPC .... *H01L 21/02389* (2013.01); *H01L 21/2007* (2013.01); *H01L 21/2036* (2013.01); *C01C 1/00* (2013.01); *C01G 15/00* (2013.01); *H01L 21/28194* (2013.01)

(58) Field of Classification Search
CPC ........... H01L 21/02389; H01L 21/2036; H01L 21/28194; C01G 15/00; C01C 1/00
See application file for complete search history.

(56) References Cited

U.S. PATENT DOCUMENTS

| | | | |
|---|---|---|---|
| 6,656,615 | B2 | 12/2003 | Dwilinski et al. |
| 7,078,731 | B2 | 7/2006 | D'Evelyn et al. |
| (Continued) | | | |

FOREIGN PATENT DOCUMENTS

| | | |
|---|---|---|
| WO | WO2007/008198 A1 | 1/2007 |
| WO | WO2007/117689 A2 | 10/2007 |
| | (Continued) | |

OTHER PUBLICATIONS

U.S. Appl. No. 15/716,491 Office Action dated Jul. 11, 2018.
(Continued)

*Primary Examiner* — Sonya D. McCall-Shepard
(74) *Attorney, Agent, or Firm* — Strategic Innovation IP Law Offices, P.C.

(57) ABSTRACT

In one instance, the seed crystal of this invention provides a nitrogen-polar c-plane surface of a GaN layer supported by a metallic plate. The coefficient of thermal expansion of the metallic plate matches that of GaN layer. The GaN layer is bonded to the metallic plate with bonding metal. The bonding metal not only bonds the GaN layer to the metallic plate but also covers the entire surface of the metallic plate to prevent corrosion of the metallic plate and optionally spontaneous nucleation of GaN on the metallic plate during the bulk GaN growth in supercritical ammonia. The bonding metal is compatible with the corrosive environment of ammonothermal growth.

10 Claims, 2 Drawing Sheets

(56) References Cited

U.S. PATENT DOCUMENTS

| | | |
|---|---|---|
| 7,132,730 B2 | 11/2006 | Dwilinski et al. |
| 7,160,388 B2 | 1/2007 | Dwilinski et al. |
| 9,048,169 B2 | 6/2015 | Arena |
| 9,650,723 B1 | 5/2017 | D'Evelyn et al. |
| 9,728,400 B2 | 8/2017 | Hanashima et al. |
| 9,790,617 B2 | 10/2017 | Hashimoto et al. |
| 9,822,465 B2 | 11/2017 | Hashimoto |
| 9,909,230 B2 | 3/2018 | Hashimoto et al. |
| 10,242,868 B1 | 3/2019 | Hashimoto et al. |
| 10,287,709 B2 | 5/2019 | Hashimoto et al. |
| 2007/0234946 A1 | 10/2007 | Hashimoto et al. |
| 2008/0111144 A1 | 5/2008 | Fichtenbaum et al. |
| 2009/0085065 A1 | 4/2009 | Mishra et al. |
| 2010/0075175 A1 | 3/2010 | Poblenz et al. |
| 2011/0256693 A1 | 10/2011 | D'Evelyn et al. |
| 2014/0084297 A1 | 3/2014 | Hashimoto |
| 2015/0340444 A1 | 11/2015 | Hashimoto et al. |
| 2016/0153115 A1 | 6/2016 | Hashimoto |
| 2016/0153118 A1 | 6/2016 | Hashimoto |
| 2016/0153120 A1 | 6/2016 | Hashimoto |
| 2016/0215410 A1 | 7/2016 | Hashimoto et al. |
| 2016/0276530 A1 | 9/2016 | Debray et al. |
| 2016/0372628 A1 | 12/2016 | Henley et al. |
| 2019/0091807 A1 | 3/2019 | Hashimoto et al. |
| 2019/0093256 A1 | 3/2019 | Hashimoto et al. |

FOREIGN PATENT DOCUMENTS

| | | |
|---|---|---|
| WO | WO2015109211 A1 | 7/2015 |
| WO | WO2019/066787 A1 | 4/2019 |

OTHER PUBLICATIONS

PCT/US2017/053566 Invitation to Pay Additional Fees dated Jun. 25, 2018.
U.S. Appl. No. 15/716,502 Office Action dated Apr. 6, 2018.
U.S. Appl. No. 15/716,502 Amendment dated Jun. 20, 2018.
U.S. Appl. No. 15/716,491 Amendment dated Sep. 26, 2018.
U.S. Appl. No. 15/716,502 Notice of Allowability dated Oct. 16, 2018.
U.S. Appl. No. 15/716,491 Office Action dated Nov. 7, 2018.
U.S. Appl. No. 15/716,491 Amendment dated Feb. 5, 2019.
U.S. Appl. No. 15/716,491 Notice of Allowability dated Mar. 4, 2019.

SEED CRYSTAL FOR GROWTH OF GALLIUM NITRIDE BULK CRYSTAL IN SUPERCRITICAL AMMONIA AND FABRICATION METHOD

CROSS REFERENCE TO RELATED APPLICATIONS

This application is related to the following U.S. patent applications:

PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS";

U.S. Utility Patent Application Ser. No. 60/973,662, filed on Sep. 19, 2007, by Tadao Hashimoto and Shuji Nakamura, entitled "GALLIUM NITRIDE BULK CRYSTALS AND THEIR GROWTH METHOD," and issued as U.S. Pat. Nos. 8,253,221 and 9,243,344;

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY," and issued as U.S. Pat. No. 7,803,344;

Allowed U.S. Utility patent application Ser. No. 12/392,960, filed on Feb. 25, 2008, by Tadao Hashimoto, Edward Letts, Masanori Ikari, entitled "METHOD FOR PRODUCING GROUP III-NITRIDE WAFERS AND GROUP III-NITRIDE WAFERS";

U.S. Patent Application Ser. No. 61/058,900, filed on Jun. 4, 2008, by Edward Letts, Tadao Hashimoto, Masanori Ikari, entitled "METHODS FOR PRODUCING IMPROVED CRYSTALLINITY GROUP III-NITRIDE CRYSTALS FROM INITIAL GROUP III-NITRIDE SEED BY AMMONOTHERMAL GROWTH," and issued as U.S. Pat. No. 8,728,234;

U.S. Utility Patent Application Ser. No. 61/058,910, filed on Jun. 4, 2008, by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL," and issued as U.S. Pat. No. 8,236,237;

U.S. Utility Patent Application Ser. No. 61/131,917, filed on Jun. 12, 2008, by Tadao Hashimoto, Masanori Ikari, Edward Letts, entitled "METHOD FOR TESTING III-NITRIDE WAFERS AND III-NITRIDE WAFERS WITH TEST DATA," and issued as U.S. Pat. Nos. 8,357,243, 8,585,822, and 8,557,043;

U.S. Utility patent application Ser. No. 12/580,849, filed on Oct. 16, 2009, by Tadao Hashimoto, Masanori Ikari, Edward Letts, entitled "REACTOR DESIGN FOR GROWING GROUP III NITRIDE CRYSTALS AND METHOD OF GROWING GROUP III NITRIDE CRYSTALS";

U.S. Utility Patent Application Ser. No. 61/694,119, filed on Aug. 28, 2012, by Tadao Hashimoto, Edward Letts, Sierra Hoff, entitled "GROUP III NITRIDE WAFER AND PRODUCTION METHOD," and issued as U.S. Pat. Nos. 9,543,393 and 8,921,231;

U.S. Utility Patent Application Ser. No. 61/705,540, filed on Sep. 25, 2012, by Tadao Hashimoto, Edward Letts, Sierra Hoff, entitled "METHOD OF GROWING GROUP III NITRIDE CRYSTALS," and issued as U.S. Pat. Nos. 9,518,340 and 9,202,872;

Allowed U.S. Utility patent application Ser. No. 14/720,819, filed on May 24, 2015, by Tadao Hashimoto, Edward Letts, entitles "GROUP III NITRIDE BULK CRYSTALS AND THEIR FABRICATION METHOD."

U.S. Utility patent application Ser. No. 15/004,464, filed on Jan. 22, 2016, by Tadao Hashimoto, Edward Letts, Daryl key, entitles "SEED SELECTION AND GROWTH METHODS FOR REDUCED-CRACK GROUP III NITRIDE BULK CRYSTALS."

which are all incorporated by reference herein in their entirety as if put forth in full below.

BACKGROUND

Field of the Invention

The invention relates to seed crystals used for growth of gallium nitride (GaN) bulk crystals and their fabrication method. Bulk crystals of GaN are sliced into semiconductor wafers to produce various devices including optoelectronic devices such as light emitting diodes (LEDs) and laser diodes (LDs), and electronic devices such as transistors. More specifically, the invention provides large-area seed crystals for growing large-diameter bulk crystal of GaN in supercritical ammonia. The invention also provides the methods of making these seed crystals.

Description of the Existing Technology

This document refers to several publications and patents as indicated with numbers within brackets, e.g., [x]. Following is a list of these publications and patents:
[1] R. Dwiliński, R. Doradziński, J. Garczyński, L. Sierzputowski, Y. Kanbara, U.S. Pat. No. 6,656,615.
[2] R. Dwiliński, R. Doradziński, J. Garczyński, L. Sierzputowski, Y. Kanbara, U.S. Pat. No. 7,132,730.
[3] R. Dwiliński, R. Doradziński, J. Garczyński, L. Sierzputowski, Y. Kanbara, U.S. Pat. No. 7,160,388.
[4] K. Fujito, T. Hashimoto, S. Nakamura, International Patent Application No. PCT/US2005/024239, WO07008198.
[5] T. Hashimoto, M. Saito, S. Nakamura, International Patent Application No. PCT/US2007/008743, WO07117689. See also US20070234946, U.S. application Ser. No. 11/784,339 filed Apr. 6, 2007.
[6] D' Evelyn, U.S. Pat. No. 7,078,731.

Each of the references listed in this document is incorporated by reference in its entirety as if put forth in full herein, and particularly with respect to their description of methods of making and using group III nitride substrates.

GaN and its related group III nitride alloys are the key material for various optoelectronic and electronic devices such as LEDs, LDs, microwave power transistors, and solar-blind photo detectors. Currently LEDs are widely used in displays, indicators, general illuminations, and LDs are used in data storage disk drives. However, the majority of these devices are grown epitaxially on heterogeneous substrates, such as sapphire and silicon carbide because GaN substrates are extremely expensive compared to these heteroepitaxial substrates. The heteroepitaxial growth of group III nitride causes highly defected or even cracked films, which hinder the realization of high-end optical and electronic devices, such as high-brightness LEDs for general lighting or high-power microwave transistors.

To solve the fundamental problems caused by heteroepitaxy, it is indispensable to utilize GaN wafers sliced from bulk GaN crystals. For the majority of devices, GaN wafers are favorable because it is relatively easy to control the conductivity of the wafer and GaN wafer will provide the smallest lattice/thermal mismatch with device layers. However, due to the high melting point and high nitrogen vapor pressure at elevated temperature, it has been difficult to grow GaN crystal ingots and slice them into wafers. Currently, the GaN wafers available in market are mainly free-standing GaN wafers produced by a method called hydride vapor phase epitaxy (HVPE). State of the art HVPE free-standing GaN wafers are produced by growing a thick GaN layer on a heteroepitaxial substrate such as sapphire and gallium arsenide, which is subsequently removed to make the layer free-standing. Due to this "quasi-bulk" method, it is difficult to reduce dislocation density less than $10^5$ cm$^{-2}$. Typically, HVPE-produced GaN has a dislocation density between $1\times10^5$ cm$^{-2}$ and $1\times10^8$ cm$^{-2}$, whereas MOCVD and MBE-produced GaN have a typical dislocation density between $1\times10^8$ cm$^{-2}$ and $1\times10^9$ cm$^{-2}$ and sodium flux-produced GaN has a dislocation density on the order of $1\times10^4$ cm$^{-2}$.

To obtain high-quality GaN wafers for which dislocation density is less than $10^5$ cm$^{-2}$, various growth methods such as ammonothermal growth, flux growth, high-temperature solution growth have been developed. Ammonothermal method grows GaN bulk crystals in supercritical ammonia [1-6]. The flux method and the high-temperature solution growth use a melt of group III metal.

Recently, high-quality GaN substrates having dislocation density less than $10^5$ cm$^{-2}$ can be obtained by the ammonothermal growth. Since the ammonothermal method can produce a true bulk crystal, one can grow one or more bulk crystals and slice them to produce GaN wafers. In the ammonothermal growth, bulk crystals of GaN are grown on seed crystals. However, since GaN crystals do not exist in nature, one must fabricate a GaN seed crystal with other method.

It is difficult to produce a seed crystal that is suitable for use in ammonothermal bulk growth. Currently, ammonothermal growth of bulk GaN uses a free-standing HVPE GaN wafer. The highest quality free-standing HVPE GaN is selected through detailed analysis (US 2016-0215410) and bulk GaN crystal as large as 2" in diameter can be obtained. However, due to large mismatch of the crystal lattice and thermal expansion coefficient, it is extremely difficult to produce free-standing GaN wafers larger than 2 inch by HVPE. Although some producers have demonstrated 4 inch and 6 inch GaN wafers by HVPE, the crystal quality is not as good as 2 inch GaN wafers formed by HVPE due to the problems associated with the heteroepitaxy (e.g. cracks, breakage). The thermal expansion mismatch causes large lattice curvature, which manifests as small radius of curvature of the crystal lattice. In addition, the stress associated with the heteroepitaxy increase the chance of cracking during processing, which decreases the production yield significantly for larger wafers. Currently, these technical limitations of HVPE limit the available size of HVPE-produced seed for the ammonothermal bulk growth.

This invention discloses large-area seed crystals for growing bulk crystal of GaN by the ammonothermal method. In addition, this invention discloses methods of fabricating such seed crystals.

SUMMARY OF THE INVENTION

In one instance, the seed crystal of this invention comprises a nitrogen-polar c-plane surface of a GaN layer supported by a metallic plate. The coefficient of thermal expansion of the metallic plate matches that of the GaN layer, as discussed below. The GaN layer is bonded to the metallic plate with a corrosion-resistant adhesive such as a bonding metal. The adhesive not only bonds the GaN layer to the metallic plate but also covers the entire surface of the metallic plate in order to prevent corrosion of the metallic plate and optionally spontaneous nucleation of GaN on the metallic plate during bulk GaN growth in supercritical ammonia. The adhesive is compatible with the corrosive environment of the ammonothermal growth.

The invention in one instance also provides a method of fabricating the seed crystal for growth of a GaN bulk crystal in supercritical ammonia. A high-quality GaN layer is grown on a heteroepitaxial substrate such as sapphire. The surface of the GaN layer is gallium-polar c-plane. Then, the surface of the GaN layer is coated with the adhesive (e.g. bonding metal). A metallic plate is prepared by coating the bonding metal on the entire surface of the metallic plate. The Ga-polar c plane of the GaN layer is bonded against the metallic plate by melting the bonding metal. Then, the heteroepitaxial substrate is removed to expose the GaN layer's nitrogen-polar surface, and is optionally followed by polishing the nitrogen-polar surface.

In addition, the invention provides methods of growing bulk crystal of gallium nitride using the seed crystal explained above in supercritical ammonia.

BRIEF DESCRIPTION OF THE DRAWINGS

Referring now to the drawings in which like reference numbers represent corresponding parts throughout.

In the figure each number represents the followings:
1. A metallic plate,
2. Bonding metal,
3. GaN crystal layer,
3B. Nitrogen-polar c-plane surface of the GaN crystal layer.

Figure 2:
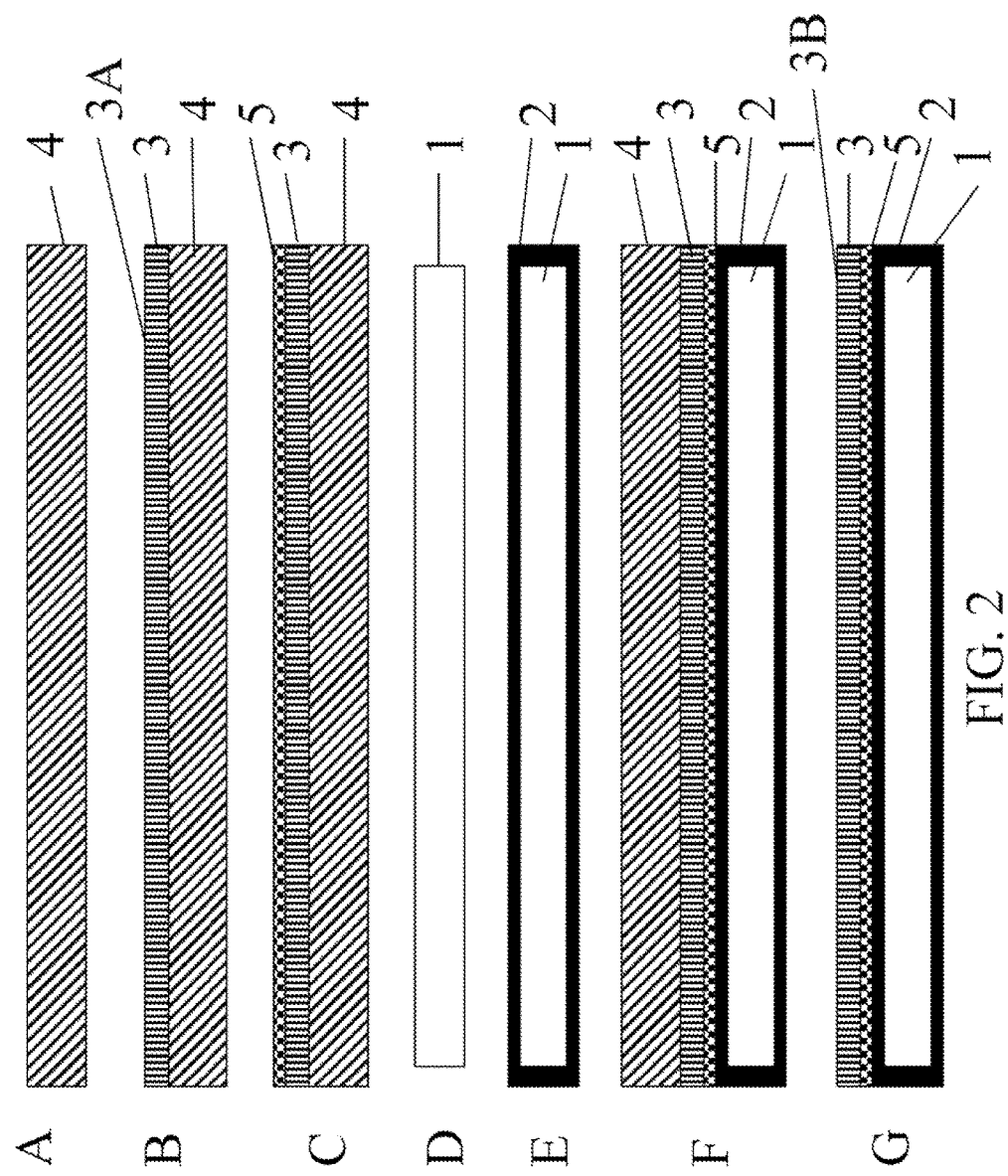

FIG. 2 is a schematic drawing of the fabrication process of the seed crystal depicted at steps A-G during fabrication of the seed crystal.

In the figure each number represents the followings:
1. A metallic plate,
2. Bonding metal,
3. GaN crystal layer,
3A. Gallium-polar c-plane surface of the GaN crystal layer,
3B. Nitrogen-polar c-plane surface of the GaN crystal layer,
4. A heteroepitaxial substrate,
5. Bonding metal on top of the gallium-polar c-plane surface of the GaN crystal layer,

DETAILED DESCRIPTION OF THE INVENTION

Technical Description of the Invention

The seed crystal of the present invention is used to grow bulk crystal of GaN in supercritical ammonia. The crystal growth method using supercritical ammonia is called ammonothermal growth. Through our development of ammonothermal growth of bulk GaN crystals, we have discovered several key technologies to obtain a crack-free GaN bulk crystal up to 2 inches using a free-standing HVPE GaN wafer as a seed crystal (e.g. Ser. Nos. 14/720,819, 15/004,464 above).

However, the market demands 4 inch or even larger GaN wafers produced by the ammonothermal growth. Since the ammonothermal growth of GaN practically does not allow lateral expansion of the crystal size during growth, a 4 inch seed is needed to grow a 4 inch bulk crystal.

Unfortunately, a 4 inch free-standing HVPE GaN wafer having a sufficient structural quality for the use of a seed crystal is not available at this moment. The current limitation of the free-standing HVPE GaN is the accumulated stress in the thick film on heteroepitaxial substrates such as sapphire or gallium arsenide. To fabricate a free-standing GaN wafer by removing the heteroepitaxial substrates, the HVPE-grown GaN film thickness must exceed the final wafer thickness, i.e. 350 microns so that the newly-grown GaN has sufficient strength to withstand various forces during substrate separation and handling. In reality, due to microcracks in the film, the GaN layer must exceed at least 500 microns. Due to high residual stress of this structure, the production yield of free-standing HVPE GaN that is usable as a seed for ammonothermal growth is quite low.

In addition, when the wafer size becomes larger, the stress value increases by the power of two (i.e. stress is proportional to (length or diameter)); therefore, it becomes extremely difficult to produce free-standing GaN wafers larger than 2 inches (surface area larger than 20 cm) with maintaining their structural quality. This limitation impedes the further development of GaN wafers by the ammonothermal growth. Therefore, this current invention presents an alternative structure to provide a seed crystal for the ammonothermal bulk growth of GaN.

Figure 1:
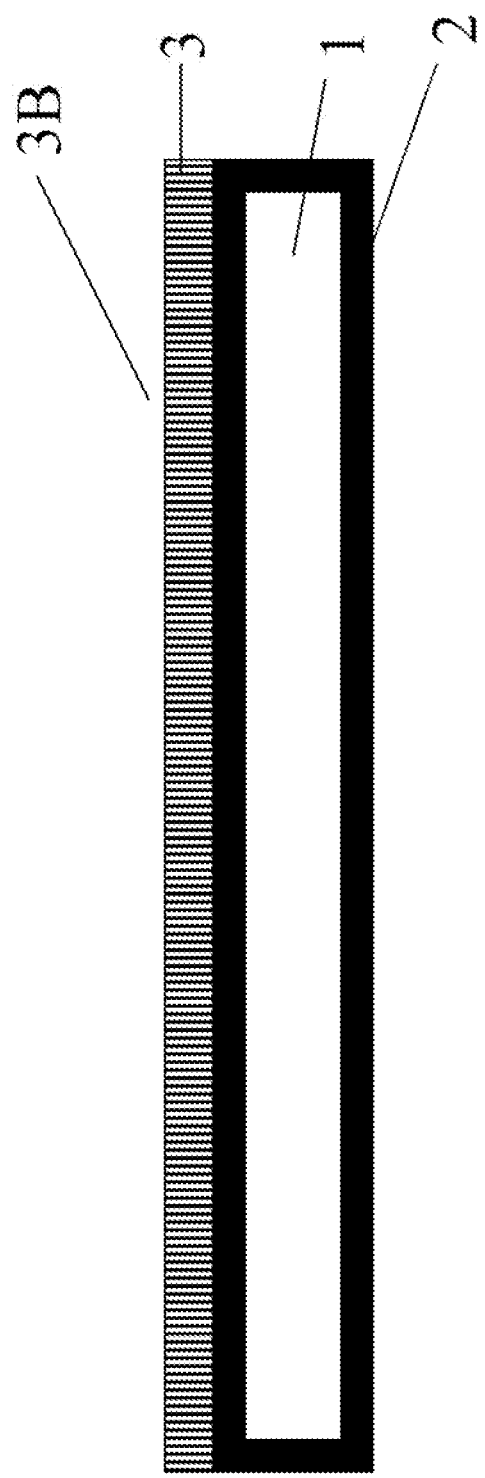
FIG. 1 is a schematic drawing of the seed crystal

FIG. 1 presents the schematic cross section of the seed crystal. The nitrogen-polar c-plane surface, 3B, of the GaN crystal layer, 3, acts as seed. Since the thickness of the GaN crystal layer, 3, is not thick enough to sustain itself as free-standing, the layer is supported by a metallic plate, 1. The GaN crystal layer, 3, is bonded with corrosion-resistant adhesive (here, bonding metal, 2), on the metallic plate, 1.

To avoid cracking of the GaN crystal layer, 3, during bonding and ammonothermal growth, the coefficient of thermal expansion of the metallic plate, 1, is closely matched to the GaN crystal layer, 3, preferably within ±20% of the coefficient of thermal expansion of GaN. Since the coefficient of thermal expansion of GaN is about 5.6e-6 (/K), tungsten, molybdenum, and hafnium can be used for the metallic plate. The coefficient of thermal expansion of tungsten, molybdenum, and hafnium is 4.5e-6 (/K), 5.0e-6 (K), and 5.9e-6 (/K), respectively. In addition, by forming an alloy based on these metals, the coefficient of thermal expansion can be matched closer. For example, by adding copper and nickel in tungsten, the coefficient of thermal expansion can be adjusted to 5.4e-6 (/K) or even closer to that of GaN. The metallic plate is sufficiently rigid that the thin GaN layer adhered to its surface is strong and withstands mechanical handling as well as stresses encountered during temperature changes encountered in the ammonothermal reactor. For example, a metallic plate may be between 0.2 mm and 5 mm thick.

In addition to the coefficient of thermal expansion, thermal conductivity can also be an important factor for avoiding cracks during bonding and ammonothermal growth in commercial processes. The thermal conductivity of tungsten, molybdenum and hafnium is 174 (W/m K), 138 (W/m K), and 23 (W/m K), respectively. Thus, tungsten, molybdenum and their alloys can serve as a good heat distributor during bonding and crystal growth. Especially, temperature non-uniformity during the melting and cooling process of the bonding metal causes cracking of the GaN crystal film. Therefore, it is preferable to choose a metal having thermal conductivity larger than 100 W/m K.

The corrosion-resistant adhesive (e.g. bonding metal) can serve three major roles if desired. The first role is that the adhesive bonds the GaN crystal layer to the metallic plate. To reduce the thermal stress and shock, it is preferable to use a bonding metal with lower melting point than the metallic plate's melting point. Second, the adhesive protects the metallic plate from the corrosive environment of ammonothermal growth. Since supercritical ammonia used in the ammonothermal growth is highly corrosive, the metallic plate is easily etched. By coating the entire surface of the metallic plate with an adhesive such as a bonding metal, such corrosion can be avoided. Third and optionally, the adhesive can help to prevent spontaneous nucleation of GaN during ammonothermal growth, thereby reducing parasitic deposition of GaN on the plate. Silver, for example, meets all three conditions, although other metals such as gallium, indium, eutectic gold tin or other eutectic bonding metal can be used.

Bulk growth of GaN in supercritical ammonia requires nitrogen-polar c-plane surface of GaN. The seed crystal of the present invention primarily exposes the nitrogen-polar c-plane surface of GaN. The gallium-polar c-plane surface of GaN is attached to the metallic plate and not exposed.

By growing the GaN crystal layer to the minimum thickness needed to reliably separate a thin HVPE-produced GaN layer from its substrate, the lattice curvature caused by accumulated stress can be reduced. So, it is possible to have HVPE-produced GaN crystal layer with curvature radius larger than 5 m. Larger curvature radius is beneficial to reduction of cracks in the bulk crystal. To achieve this situation, the thickness of the GaN crystal layer is controlled between 10 and 150 microns.

FIG. 2 presents the process flow to produce the seed crystal in the present invention. FIG. 2A shows a heteroepitaxial substrate, 4. Among the potential heteroepitaxial substrates such as sapphire, silicon carbide, silicon, and gallium arsenide, sapphire yields the GaN crystal layer with the highest structural quality. So, it is preferable to use sapphire. The surface orientation is c-plane.

To grow GaN crystal layer on sapphire, vapor phase method such as HVPE, metalorganic chemical vapor deposition (MOCVD), molecular beam epitaxy, and sputtering, pulsed laser deposition can be used. Currently HVPE is the most preferred method to obtain GaN crystal layer of thickness between 10 and 150 microns. Also, liquid phase method such as sodium flux method can be used as well. By minimizing the layer thickness, the amount of stress in the GaN crystal layer can be minimized. This will minimize the lattice curvature and cracking. The cross-section of the GaN crystal layer, 3, grown on a heteroepitaxial substrate, 4, is shown in FIG. 2B. The top surface of the GaN crystal layer is gallium polar c-plane, 3A.

After the growth of the GaN crystal layer, 3, on the heteroepitaxial substrate, 4, bonding metal, 5, is deposited on the top surface of the GaN crystal layer, 3, as shown in FIG. 2C. Silver is the most preferable material for the bonding metal although other metals including gallium, indium, eutectic gold tin or other eutectic bonding metal can be used. A conventional metallization process such as thermal evaporation, e-beam evaporation and sputtering can be used. If necessary, another metal can be inserted between the GaN crystal layer and the bonding metal to ensure adhesion of the bonding metal to the GaN crystal layer. For example, to ensure adhesion of silver adhesive to the Ga polar surface of the GaN crystal layer, nickel can be inserted between silver and the GaN crystal layer. Nickel can be deposited using a conventional method such as electron beam evaporation.

A metallic plate, 1, is prepared (FIG. 2D) to support the GaN crystal layer. The entire surface of the metallic plate is preferably coated with the bonding metal as shown in FIG. 2E (optionally including the plate's edges as well as the plate's major surfaces). This can be done with electroplating or other coating method.

Then, the GaN crystal layer on the heteroepitaxial substrate is pressed against the metallic plate (FIG. 2F) The parts are heated while maintaining pressure on the parts to melt the bonding metal and assure that the parts maintain contact with the bonding metal acting as the corrosion-resistant adhesive. After melting the bonding metal, the part is cooled to room temperature. The temperature ramp rate and cooling rate are sufficiently low to avoid cracking the thin GaN crystal layer, 3.

After bonding, the heteroepitaxial substrate, 4, is removed (FIG. 2G). When a double-side polished sapphire substrate is used to form the thin GaN layer via e.g. hydride vapor phase epitaxy, the sapphire substrate can be removed by irradiating the backside of the sapphire using ultraviolet laser light (laser lift-off). The laser light is absorbed at the interface between the GaN crystal layer and the sapphire and decomposes GaN, leaving metallic gallium at the interface. By heating the part to a temperature higher than the melting point of gallium, the sapphire substrate can be removed from the thin GaN layer. Another way of removing the heteroepitaxial substrate is to mechanically grind the substrate. Using diamond grinding wheel, the heteroepitaxial substrate can be removed.

The general method described above may also be modified as follows. The GaN crystal layer and substrate may be irradiated using UV laser light to partially damage their interface and provide a very small amount of metallic gallium between GaN and substrate at the interface. Laser irradiation can occur either before bonding metal is applied or after bonding metal is applied to the Ga-polar surface of the GaN layer and before bonding the GaN layer to the metal plate. This method enables the substrate (e.g. sapphire) to separate from the GaN layer more easily or even self-separate during cooling after the metal plate has been bonded to the GaN layer and its substrate. Consequently, it may not be necessary to irradiate the GaN-substrate interface after bonding the GaN layer and its substrate to the metal plate, although this step may be performed if desired.

After removal of the heteroepitaxial substrate, the exposed nitrogen polar c-plane of GaN crystal layer is lapped, mechanically polished and chemomechanically polished to obtain an appropriate surface quality for growth of bulk GaN by the ammonothermal method. The removal of subsurface damage can be evaluated by a glancing angle x-ray rocking curve using 114 diffraction plane of GaN (U.S. Ser. No. 13/798,580).

Example 1

A GaN crystal layer having thickness of 20 microns is grown on a double-side polished 4" c-plane sapphire substrate. The dislocation density of the GaN crystal layer is in the order of $10^7$ cm$^{-2}$, confirmed with cathodeluminescence. The top surface of the GaN crystal layer is gallium polar c-plane. Using electron beam evaporator, silver is deposited on the gallium polar c-plane surface of the GaN crystal layer. The thickness of the silver is approximately 0.5 micron, measured with thickness monitor of the electron beam evaporator. A 4" metallic plate made of tungsten-nickel-copper alloy (90% W 6% Ni 4% Cu) is prepared. The coefficient of thermal expansion is about 5.4e-6 (1/K) and thermal conductivity is about 230 W/m K. The thickness of the plate is ⅛". The entire surface of the metallic plate is electroplated with silver. The GaN crystal layer on the 4" sapphire is placed on top of the metallic plate so that the silver layers of the both parts meet together. A weight plate made of the tungsten alloy is placed on top of the sapphire to apply compressive pressure to the parts. The three pieces of the plates (i.e. the silver plated metallic plate, GaN crystal layer on sapphire and the weight plate) are loaded into an electric furnace. The furnace temperature is raised to 1000° C. in 1 hour, held for 10 minutes and cooled to 900° C. in 15 minutes. The furnace was maintained at 900° C. for 30 minutes and then cooled to the room temperature in 2 hours. Holding the temperature at 900° C. ensures complete bonding of the GaN crystal layer to the metallic plate with maintaining the flatness of the GaN crystal layer. This is explained as follows: The as grown GaN crystal layer on sapphire is typically bowed convex toward the gallium polar c-plane at room temperature due to mismatch of the coefficient of thermal expansion between GaN and sapphire. This bi-layer structure flattens at 1000° C. because the GaN crystal layer is typically grown at about 1000° C. Therefore, the GaN crystal layer on sapphire flattens at 1000° C., at which temperature silver melts. Holding the temperature at 900° C. helps the GaN crystal layer bonds to the metallic place flat. After the complete bonding, the metallic plate prevents bowing of the sapphire upon cooling. This way, the GaN crystal layer is attached flat to the metallic plate. If heating and cooling is too fast, the GaN crystal layer as well as the sapphire can be cracked. The high thermal conductivity of the W—Ni—Cu alloy helps to equalize the temperature over the entire area. After cooling the attached parts, excimer laser light is irradiated to the backside for the sapphire. Since the laser spot is about 3 mm×3 mm, scanning of the work piece is required to irradiate the entire backside of the part. After irradiation of UV laser light, the part is heated to 40° C. in water to remove the sapphire (laser lift-off process). The exposed nitrogen polar surface of the GaN crystal layer is lapped with 3 micron diamond slurry, polished with 1 micron diamond slurry and chemomechanically polished with CMP slurry. This way, the seed crystal of the present invention is produced. Other seeds are produced by substituting the following metallic plates individually in place of the tungsten-nickel-copper alloy: tungsten (pure); molybdenum; Mo-0.5Ti-0.08Zr (TZM) alloy; hafnium; Hf-(0.6-2.1)Zr.

Other seeds are produced using gallium, indium, and eutectic gold tin bonding metals individually in place of silver in each of the plates above.

Gallium nitride thin films are formed by depositing them on AlN and AlGaN transition layers deposited on silicon substrates. Other thin gallium nitride films are formed on a silicon carbide substrate as well.

Other seeds of the invention are produced by repeating the procedure above on the opposite side of the metal plate, so that the metallic plate has a first gallium nitride layer on a first side of the metallic plate and a second gallium nitride layer on the second side of the metallic plate. The exposed gallium nitride surfaces may both be nitrogen-polar surfaces, for instance.

Example 2

A GaN crystal layer having thickness of 20 microns is grown on a double-side polished 4" c-plane sapphire substrate. The dislocation density of the GaN crystal layer is in the order of $10^7$ cm$^{-2}$, confirmed with cathodeluminescence. The top surface of the GaN crystal layer is gallium polar c-plane. The interface between the GaN crystal layer and the sapphire substrate is irradiated with UV laser from backside in order to partially damage the interface. This process induces self-separation of the sapphire substrate during cooling after bonding. Using electron beam evaporator, silver is deposited on the gallium polar c-plane surface of the GaN crystal layer. The thickness of the silver is approximately 0.5 micron, measured with thickness monitor of the electron beam evaporator. A 4" metallic plate made of tungsten-nickel-copper alloy (90% W 6% Ni 4% Cu) is prepared. The coefficient of thermal expansion is about 5.4e-6 (1/K) and thermal conductivity is about 230 W/m K. The thickness of the plate is ⅛". The entire surface of the metallic plate is electroplated with silver. The GaN crystal layer on the 4" sapphire is placed on top of the metallic plate so that the silver layers of the both parts meet together. A weight plate made of the tungsten alloy is placed on top of the sapphire to apply compressive pressure to the parts. The three pieces of the plates (i.e. the silver plated metallic plate, GaN crystal layer on sapphire and the weight plate) are loaded into an electric furnace. The furnace temperature is raised to 1000° C. in 1 hour, held for 10 minutes and cooled to 900° C. in 15 minutes. The furnace was maintained at 900° C. for 30 minutes and then cooled to the room temperature in 2 hours. Holding the temperature at 900° C. ensures complete bonding of the GaN crystal layer to the metallic plate with maintaining the flatness of the GaN crystal layer. During cooling, the thermal shrink of sapphire causes horizontal breakage along the pre-induced damage between the GaN crystal layer and sapphire, resulting in self-separation of sapphire from the part. The high thermal conductivity of the W—Ni—Cu alloy helps to equalize the temperature over the entire area. The exposed nitrogen polar surface of the GaN crystal layer is lapped with 3 micron diamond slurry, polished with 1 micron diamond slurry and chemomechanically polished with CMP slurry. This way, the seed crystal of the present invention is produced.

Example 3

Any of the seeds as formed in Example 1 or Example 2 are placed in an autoclave along with ammonia, nutrient such as recycled gallium nitride and/or gallium, and a mineralizer (acidic or basic such as metallic sodium). The autoclave is heated so that the chamber within the autoclave attains sufficient temperature and pressure for the ammonia to be supercritical and sufficient for ammonothermal gallium nitride growth. The autoclave is maintained under ammonothermal growth conditions for a sufficient time to form a bulk crystal of gallium nitride using the gallium nitride layer adhered to the metallic plate. The metallic plate is separated from the bulk crystal by e.g. heating the bulk crystal and metallic plate to a temperature that releases the metallic plate from the bulk crystal. For instance, the temperature is increased above the melt point of a bonding metal used to adhere to the metallic plate. Alternatively, the metallic place is separated from the bulk crystal by cutting the crystal with a mechanical way such as a wire saw or inner-blade cutter.

Thus, the invention in various embodiments includes:

1. A seed crystal for growing a gallium nitride bulk crystal in supercritical ammonia comprising a metallic plate and a gallium nitride crystal layer adhered to the metallic plate with a corrosion resistant adhesive, wherein
   (a) the gallium-polar c-plane of the gallium nitride crystal layer is bonded to the metallic plate by the corrosion resistant adhesive and the corrosion resistant adhesive comprises a bonding metal,
   (b) the nitrogen-polar c-plane of the gallium nitride crystal layer has a surface area preferably larger than 20 cm$^2$, and
   (c) the difference between the thermal expansion coefficient of the gallium nitride crystal layer and the metallic plate is less than 20% of the thermal expansion coefficient of the gallium nitride crystal layer.
2. A seed crystal according to paragraph 1, wherein the thermal conductivity of the metallic plate is larger than 100 W/m K.
3. A seed crystal according to paragraph 1 or paragraph 2, wherein the metallic plate comprises tungsten or tungsten alloy.
4. A seed crystal according to any of paragraphs 1 through 3, wherein the bonding metal is composed of a different kind of metal from the metallic plate, and the melting temperature of the bonding metal is lower than the metallic plate.
5. A seed crystal according to any paragraphs 1 through 4, wherein the bonding metal covers the entire surface of the metallic plate so that the only exposed materials of the seed crystal are the gallium nitride crystal and the bonding metal.
6. A seed crystal according to paragraph 5, wherein the bonding metal has insufficient reactivity with gallium and with nitrogen under ammonothermal growth conditions to prevent spontaneous nucleation of gallium nitride crystal in supercritical ammonia.
7. A seed crystal according to paragraph 6, wherein the bonding metal comprises silver.
8. A seed crystal according to any of paragraphs 1 through 7, wherein the thickness of the gallium nitride crystal layer is more than 10 microns and less than 150 microns.
9. A seed crystal according to any of paragraphs 1 through 8, wherein the lattice curvature of the gallium nitride crystal layer is more than 5 m.
10. A seed crystal according to paragraph 9, wherein the surface of the nitrogen polar c-plane of the gallium nitride crystal is a polished surface with sufficient smoothness to provide a suitable surface for bulk crystal growth in supercritical ammonia.

11. A seed crystal according to any of paragraphs 1 through 10, wherein the gallium nitride crystal has a dislocation density greater than $10^5$ cm$^{-2}$.
12. A seed crystal according to paragraph 11, wherein the gallium nitride crystal has a dislocation density between $1\times10^5$ cm$^{-2}$ and $1\times10^7$ cm$^{-2}$.
13. A seed crystal according to any of paragraphs 1 through 12, wherein the gallium nitride crystal is a hydride vapor phase epitaxy crystal.
14. A seed crystal according to any paragraph above wherein the nitrogen polar surface of the gallium nitride crystal is exposed for bulk crystal growth.
15. A seed crystal according to any of paragraphs 1 through 13, wherein the seed crystal further comprises a substrate in contact with the nitrogen polar surface of the gallium nitride crystal, and metallic gallium is present at the interface between the substrate and the nitrogen polar surface.
16. A method of fabricating a seed crystal for growing a gallium nitride bulk crystal in supercritical ammonia comprising:
    (a) coating the gallium polar c-plane surface of a gallium nitride crystal layer with a corrosion resistant adhesive that comprises a bonding metal,
    (b) coating the entire surface of a metallic plate with the corrosion resistant adhesive,
    (c) bonding the gallium polar c-plane to the metallic plate with the bonding metal, and
    (d) removing the substrate to expose the nitrogen polar c-plane of the gallium nitride crystal layer.
17. A method of fabricating a seed crystal according to paragraph 16, wherein the difference of the thermal expansion coefficient between the gallium nitride crystal layer and the metallic plate is less than 20% of the thermal expansion coefficient of the gallium nitride crystal layer, and the thermal conductivity of the metallic plate is larger than 100 W/m K.
18. A method of fabricating a seed crystal according to paragraph 16 or paragraph 17, wherein the metallic plate comprises tungsten or tungsten alloy.
19. A method of fabricating a seed crystal according to any of paragraphs 16 through 18, wherein the corrosion resistant adhesive comprises a bonding metal composed of a different kind of metal from the metallic plate, and the melting temperature of the bonding metal is lower than the metallic plate.
20. A method according to paragraph 19 comprising melting the bonding metal to secure the gallium nitride layer to the metallic plate.
21. A method of fabricating a seed crystal according to paragraph 19 or paragraph 20, wherein the bonding metal has a sufficient low reactivity with gallium and with nitrogen under ammonothermal growth conditions to prevent spontaneous nucleation of gallium nitride in supercritical ammonia.
22. A method of fabricating a seed crystal according to any of paragraphs 16 through 21, wherein the bonding metal is silver.
23. A method of fabricating a seed crystal according to paragraphs 19 through 22, wherein the substrate is c-plane sapphire and the thickness of the crystalline gallium nitride layer is less than 150 microns.
24. A method of fabricating a seed crystal according to paragraph 23, wherein the step (d) utilizes laser irradiation of the interface between the gallium nitride crystal layer and the substrate.
25. A method according to paragraph 24, wherein the laser irradiation occurs prior to step (c) of paragraph 16.
26. A method of fabricating a seed crystal according to paragraph 23, wherein the step (d) utilizes mechanical grinding.
27. A method according to any of paragraphs 16 through 26 further comprising polishing the nitrogen polar c-plane of the gallium nitride crystal layer.
28. A method of fabricating a seed crystal according to paragraph 27, wherein the lattice curvature of the gallium nitride crystal layer is more than 5 m.
29. A method of removing a GaN crystal layer from a substrate on which the GaN crystal layer was grown and consequently has crystalline structure continuity at the interface, comprising (a) irradiating the interface with UV light to damage the crystalline material and form metallic gallium at the interface; (b) adhering the GaN crystal layer to a metal plate using an adhesive, thereby forming a unitary structure; and (c) cooling the unitary structure to release the substrate from the GaN crystal layer that is adhered to the metal plate.
30. A method according to any of paragraphs 16 through 29, wherein the gallium nitride crystal layer has a dislocation density greater than $10^5$ cm$^{-2}$.
31. A method according to paragraph 30, wherein the gallium nitride crystal layer has a dislocation density between $1\times10^5$ cm$^{-2}$ and $1\times10^7$ cm$^{-2}$.
32. A method according to any of paragraphs 16 through 31, wherein the gallium nitride crystal layer is a hydride vapor phase epitaxy crystal.
33. A method according to any of paragraphs 29 through 32, wherein the metallic plate comprises tungsten or tungsten alloy.
34. A method according to any of paragraphs 29 through 33, wherein the corrosion resistant adhesive comprises a bonding metal.
35. A method according to paragraph 34 comprising melting the bonding metal to secure the gallium nitride layer to the metallic plate.
36. A method according to paragraph 34 or paragraph 35, wherein the bonding metal has a sufficient low reactivity with gallium and with nitrogen under ammonothermal growth conditions to prevent spontaneous nucleation of gallium nitride in supercritical ammonia.
37. A method according to any of paragraphs 34 through 36, wherein the bonding metal is silver.
38. A method according to paragraphs 29 through 37, wherein the substrate is c-plane sapphire and the thickness of the crystalline gallium nitride layer is less than 150 microns.
39. A method of growing gallium nitride bulk crystal using the seed crystal of any of paragraphs 1 through 15 in ammonothermal growth of gallium nitride in supercritical ammonia.

Advantages and Improvements

The size of the GaN layer of the seed crystal of this invention is therefore not limited and can be e.g. 6 inch because currently 6 inch sapphire substrates can be obtained commercially. In addition, if silicon is used as a substrate, the GaN layer can be as large as 450 mm using commercially-available Si wafers. The present invention obviously has the advantage of providing very large seed crystals for use in ammonothermal growth, where the seed crystals are formed by a method other than the ammonothermal method. In addition, by using a relatively thin layer of GaN crystal (10~150 microns vs. 350~450 microns for free-standing GaN), the cost to produce the seed crystal of this invention is greatly reduced. Further, due to reduced residual stress in the thin GaN crystal layer, the invention can also reduce the probability that the thin GaN layer cracks during ammonothermal growth, resulting in higher production yield for the seed crystal of the invention.

Possible Modifications

Although the example describes a double-side polished sapphire as a substrate, other substrates such as a single-side polished sapphire, silicon carbide, silicon, and gallium arsenide can be used as an alternative substrate.

Although the example describes tungsten-nickel-copper alloy as a material for the metallic plate, other metallic plate such as tungsten-nickel-iron alloy, other tungsten alloy, pure tungsten, molybdenum, and molybdenum alloys can be used as long as the difference of the coefficient of thermal expansion from GaN is less than 20% and thermal conductivity is more than 100 W/m K.

Although the preferred embodiment describes HVPE as an epitaxial growth method, other methods such as MOCVD, MBE, a flux method, high-pressure solution growth, sputtering or pulsed laser deposition can be used as long as they are compatible with the substrates.

Although the preferred embodiment describes a seed crystal having a diameter of 4", similar benefit of this invention is expected for a larger diameter such as 6" and larger.

Although the preferred embodiment describes silver as a bonding material, other bonding material such as gallium, indium, eutectic gold tin or other eutectic bonding metals can be used as long as the metal is chemically compatible with the ammonothermal growth environment and optionally prevents spontaneous nucleation of GaN during the ammonothermal growth.

Although the example describes a laser lift-off to remove the sapphire substrate, other methods such as mechanical grinding can be used to remove the substrate.

What is claimed is:

1. A method of removing a GaN crystal layer from a crystalline substrate on which the GaN crystal layer was grown and consequently has crystalline structure continuity at the interface, comprising (a) irradiating the interface with UV light to damage crystalline material at the interface and form metallic gallium at the interface; (b) adhering the GaN crystal layer to a metal plate using an adhesive, thereby forming a unitary structure that comprises the crystalline substrate on one side of the GaN crystal layer and the metal plate on an opposite side of the GaN crystal layer; and (c) cooling the unitary structure to release the substrate from the GaN crystal layer that is adhered to the metal plate.

2. A method according to claim 1, wherein the gallium nitride crystal layer has a dislocation density greater than $10^5$ cm$^{-2}$.

3. A method according to claim 2, wherein the gallium nitride crystal layer has a dislocation density between $1\times10^5$ cm$^{-2}$ and $1\times10^7$ cm$^{-2}$.

4. A method according to claim 1, wherein the gallium nitride crystal layer is a hydride vapor phase epitaxy crystal.

5. A method according to claim 1, wherein the metallic plate comprises tungsten or tungsten alloy.

6. A method according to claim 1, wherein the adhesive comprises a bonding metal.

7. A method according to claim 6, comprising melting the bonding metal to secure the gallium nitride layer to the metallic plate.

8. A method according to claim 7, wherein the bonding metal has a sufficient low reactivity with gallium and with nitrogen under ammonothermal growth conditions to prevent spontaneous nucleation of gallium nitride in supercritical ammonia.

9. A method according to claim 8, wherein the bonding metal is silver.

10. A method according to claim 1, wherein the substrate is c-plane sapphire and the thickness of the crystalline gallium nitride layer is less than 150 microns.

* * * * *